United States Patent [19]
Macdonald et al.

[11] Patent Number: 5,528,209
[45] Date of Patent: Jun. 18, 1996

[54] MONOLITHIC MICROWAVE INTEGRATED CIRCUIT AND METHOD

[75] Inventors: Perry A. Macdonald, Culver City, Calif.; Lawrence E. Larson, Bethesda, Md.; Michael G. Case, Thousand Oaks, Calif.; Mehran Matloubian, Encino, Calif.; Mary Y. Chen, Agoura, Calif.; David B. Rensch, Thousand Oaks, Calif.

[73] Assignee: Hughes Aircraft Company, Los Angeles, Calif.

[21] Appl. No.: 430,067

[22] Filed: Apr. 27, 1995

[51] Int. Cl.$^6$ .................................. H01P 5/00; H01P 3/08
[52] U.S. Cl. ...................... 333/247; 257/691; 330/295
[58] Field of Search ............................. 333/247; 330/286, 330/295; 257/664, 691, 728

[56] References Cited

U.S. PATENT DOCUMENTS 5,202,752  4/1993  Honjo .................... 333/247 X
5,352,998  10/1994  Tanino .................... 333/247

OTHER PUBLICATIONS

Sakai, H. et al., "A novel millimeter–wave IC on Si Substrate – – – ", *1994 IEEE MTT–S Digest*, pp. 1763–1766.
Gong, Shao–Fang et al., "Investigations of High–Speed Pulse Transmission in MCM–D", *1IEEE Transactions on Components, Hybrids and Manufacturing Technology.* 1, vol. 16, No. 7, Nov., 1993, pp. 735–742.
Chinoy, Percy B. et al., "Processing and microwave characterization of multilevel interconnects – – – ", *IEEE Transactions on Components, Hybrids and Manufacturing Technology.* 1, vol. 16, No. 7, Nov., 1993, pp. 714–718.

*Primary Examiner*—Paul Gensler
*Attorney, Agent, or Firm*—V. D. Duraiswamy; W. K. Denson-Low

[57] ABSTRACT

A monolithic microwave integrated circuit is formed by positioning a distributed, transmission-line network over a microwave-device structure. The ground plane of the transmission-line network adjoins an interconnect system of the microwave-device structure and signal lines of the transmission-line network are adapted to communicate with the microwave-device structure through orifices of the ground plane. The invention facilitates the use of low-cost silicon-based transistors in monolithic microwave integrated circuits.

13 Claims, 4 Drawing Sheets

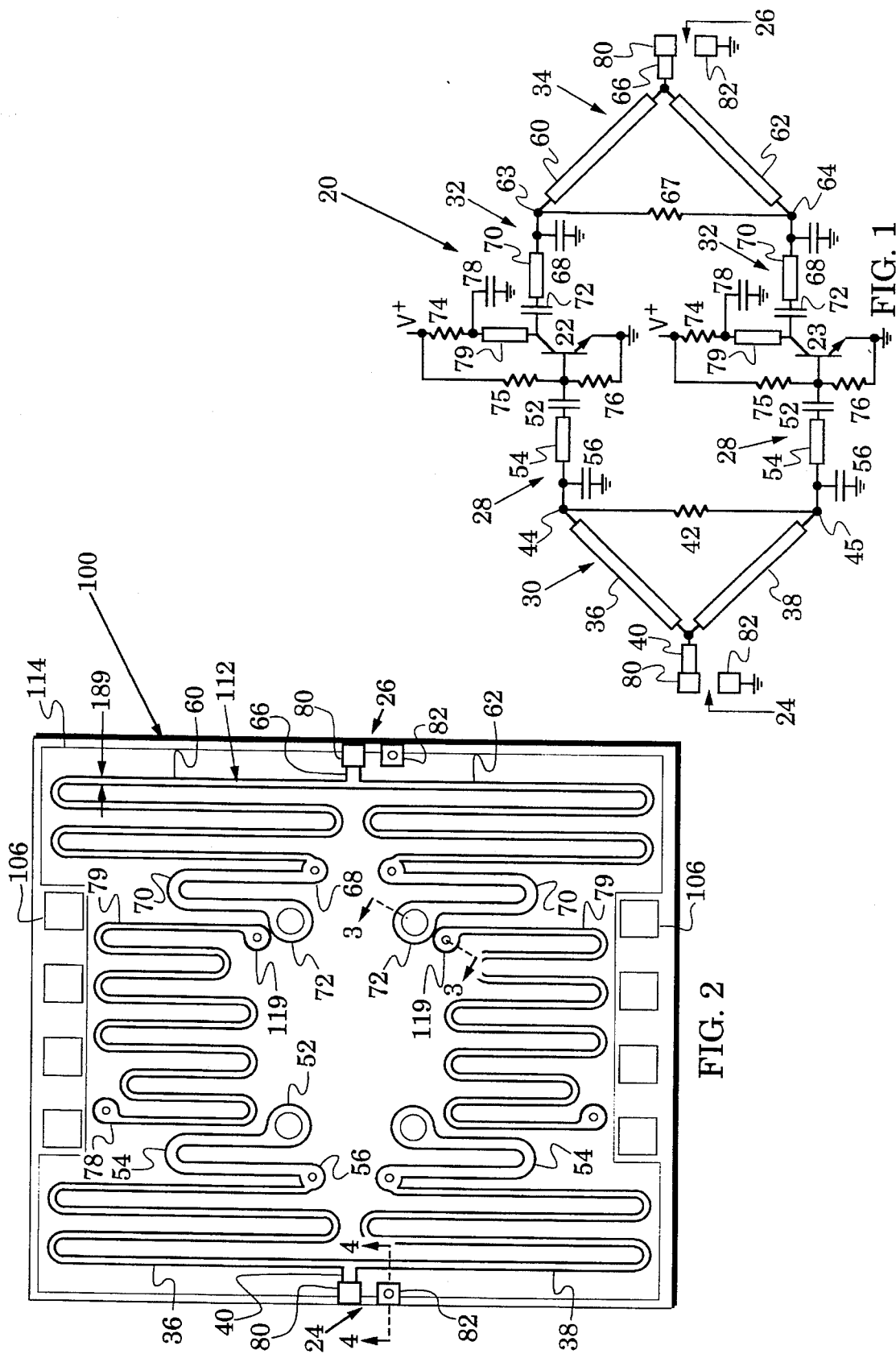

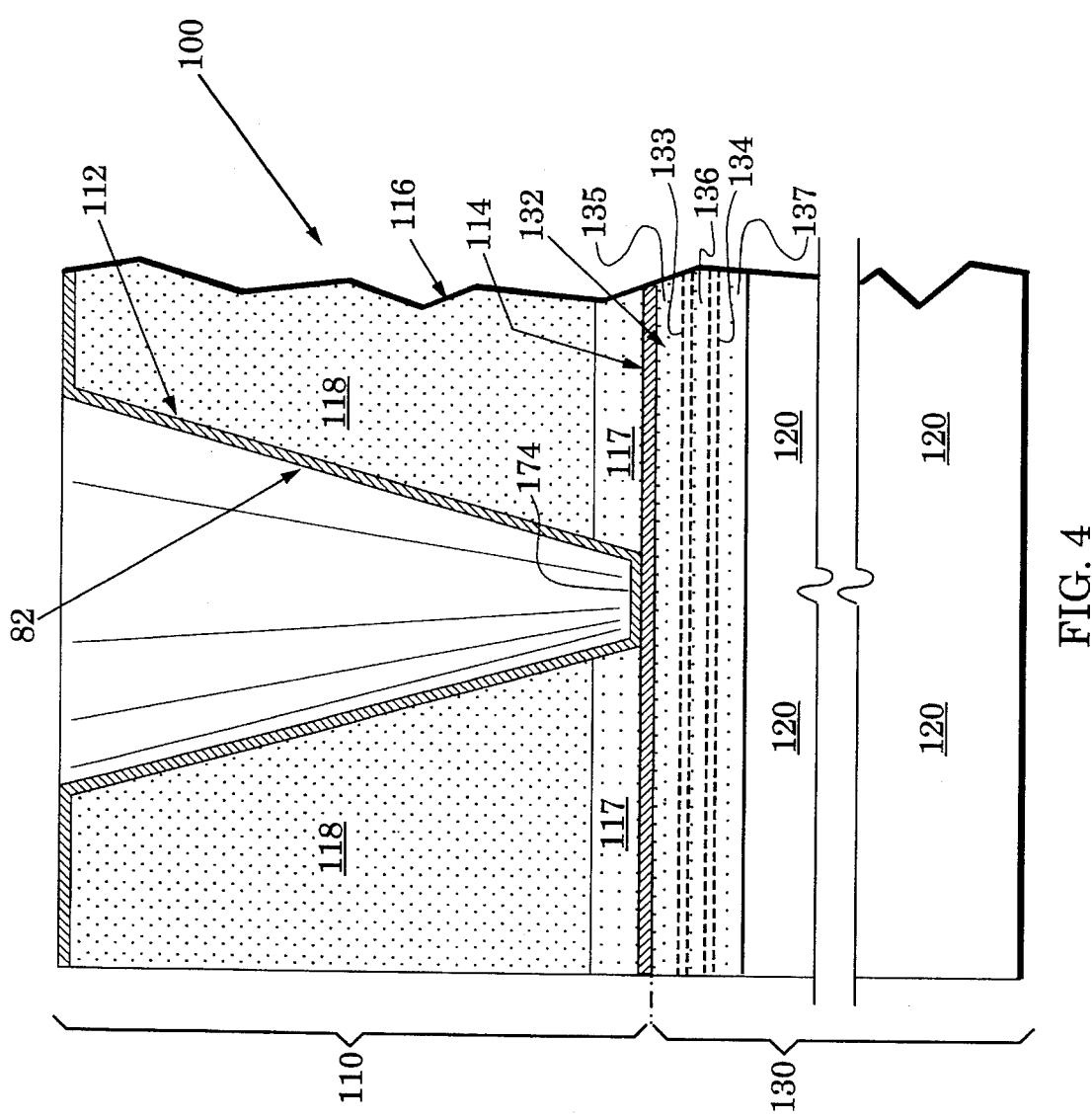

MONOLITHIC MICROWAVE INTEGRATED CIRCUIT AND METHOD

BACKGROUND OF THE INVENTION

1. Field of the Invention

The present invention relates generally to monolithic microwave integrated circuits.

2. Description of the Related Art

The dual developments of compound semiconductors and heterostructure transistors have facilitated the improved frequency performance of microwave and millimeter-wave circuits. For example, superior high-frequency performance has been achieved by forming each transistor region of heterojunction bipolar transistors (HBTs) with semiconductors of selected bandgaps. In an exemplary HBT, the emitter semiconductor is chosen to have a greater bandgap than the base semiconductor. This allows the emitter to be heavily doped for increased emitter efficiency and the base to be heavily doped and narrowed without increasing base resistance. In addition, the collector semiconductor can be chosen to increase the transistor's breakdown voltage.

Previously, realization of the advantages of heterostructure transistors was primarily limited to the gallium aluminum arsenide/gallium arsenide (GaAlAs/GaAs) and indium gallium arsenide/indium phosphide (InGaAs/InP) semiconductor systems. The advantages of the GaAlAs/GaAs system include an excellent lattice match, well-developed growth technologies (e.g., molecular beam epitaxy and metal-organic chemical vapor deposition), availability of large bandgap differences, high electron mobility, and a semi-insulating GaAs substrate. GaAlAs/GaAs HBTs have achieved unit current gain cutoff frequencies ($f_T$) of 100GHz.

The advantages of the InGaAs/InP system include a good lattice match, the same well-developed growth technologies of the GaAlAs/GaAs system, an electron mobility even higher than GaAs, availability of even larger bandgaps, and a semi-insulating substrate of InP which has a good thermal conductivity. HBTs in the InGaAs/InP system have achieved $f_T$ values of 165 GHz.

Conduction of microwave signals in these semiconductor systems is typically accomplished with microwave transmission structures such as microstrip. The dielectric of these structures preferably has a low dielectric constant and a low loss tangent to reduce parasitic capacitances and dielectric losses. Typically, the substrate of these semiconductor systems has formed the dielectric of the microwave transmission lines. Substrates in the GaAlAs/GaAs and InGaAs/InP systems can be fabricated with high resistivities (e.g., $10^8 \Omega$-cm) through the addition of carrier-trapping impurities such as chrome or iron. Accordingly, these substrates can be used to form low-loss transmission lines.

Recently, another semiconductor system has shown promise in the microwave and millimeter-wave regions. This is the SiGe/Si system. $Ge_xSi_{1-x}$ is an alloy with a lattice constant that is mismatched from Si. The SiGe/Si system has been shown to have excellent high-frequency performance. For example, Si/SiGe HBTs have achieved $f_T$ values of 70 GHz. In addition, silicon has far and away the most mature semiconductor technology and enjoys a significant cost advantage over other semiconductor systems.

However, in contrast with the GaAlAs/GaAs and InGaAs/InP systems, the resistivity of silicon is limited (e.g., to ~$10^4 \Omega$-cm) because the resistivity of silicon can only be increased by purification. Consequently, microwave transmission lines fabricated over silicon substrates produce undesirable losses. Primarily for this reason, MMICs constructed in the low-cost SiGe/Si system have not exhibited competitive performance.

Sakai, Hiroyuki, et al. have proposed (Sakai, H. et al., "A novel millimeter-wave IC on Si Substrate", 1994 *IEEE MTT-S Digest*, pp. 1763–1766) a microstrip transmission line whose ground plane is fabricated on the surface of a highly-doped, silicon substrate. In this structure, millimeter-wave heterojunction transistor chips are inverted and bonded to signal lines of the transmission line. Although this technique realizes microwave circuits with a low-cost silicon substrate, it fails to take advantage of the high yields and inherent cost savings of monolithic circuit fabrication.

SUMMARY OF THE INVENTION

The present invention is directed to a monolithic microwave integrated circuit structure which combines low-loss microwave transmission paths with semiconductor structures that are preferably silicon-based for low-cost production. This goal is achieved with the recognition that a distributed, transmission-line network with a ground plane can be positioned over a semiconductor structure and signal lines of the transmission network adapted to communicate with the semiconductor system through the network's ground plane.

In an embodiment, a microwave-device structure positions microwave devices, e.g., silicon-based HBTs, on a silicon substrate and electrically connects them through an interconnect system of alternating layers of conductive members and insulating dielectrics. The ground plane of a distributed, transmission-line network is carried over the interconnect system. Signal lines of the transmission network are spaced from the ground plane by a microwave dielectric. An aperture is formed in the ground plane and a signal line adapted to communicate with selected microwave devices through the aperture. Alternatively, a pad can be left in the aperture and the spacing between the pad and a signal line portion reduced to form a microwave capacitor.

The loss through microstrip transmission lines is reduced when the signal line width is increased and, to achieve a selected impedance, wider lines can be used if the spacing between the signal line and the ground plane is increased. Accordingly, the microwave dielectric is preferably selected from materials, e.g., benzocyclobutene, that can be formed in a thick planar layer, e.g., 13 microns.

The novel features of the invention are set forth with particularity in the appended claims. The invention will be best understood from the following description when read in conjunction with the accompanying drawings.

BRIEF DESCRIPTION OF THE DRAWINGS

FIG. 1 is a schematic of an exemplary microwave amplifier circuit;

FIG. 2 is a plan view of a monolithic microwave integrated circuit (MMIC) in accordance with the present invention, which realizes the schematic of FIG. 1;

FIG. 4 is an enlarged view of MMIC structure along the plane 4—4 of FIG. 2;

FIG. 5 is a plan view of a spiral inductor in accordance with the present invention;

DESCRIPTION OF THE PREFERRED EMBODIMENTS

Figure 3:
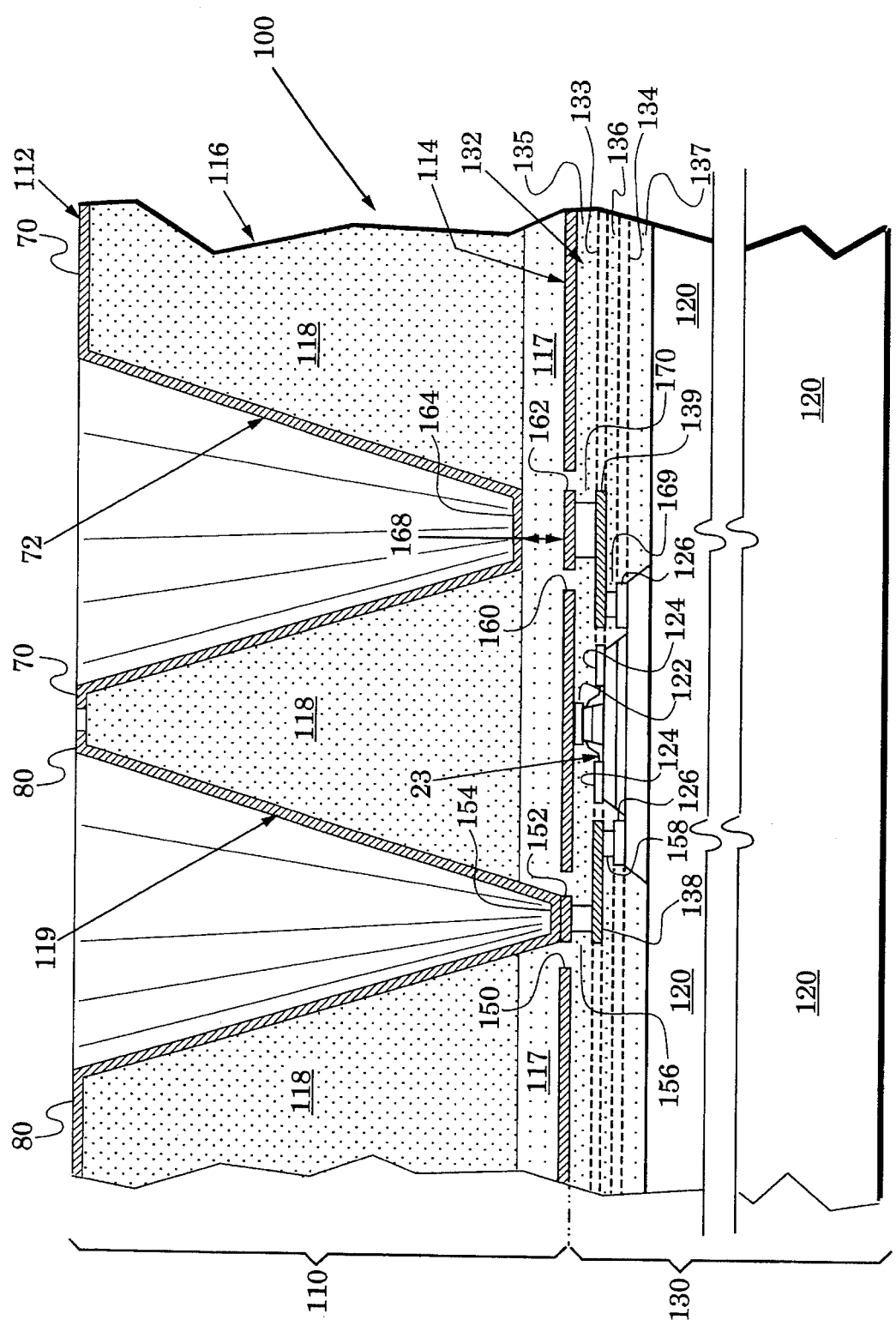
FIG. 3 is an enlarged view of MMIC structure along the plane 3—3 of FIG. 2.

An exemplary microwave circuit 20 is shown in FIG. 1, and FIGS. 2–4 illustrate a MMIC 100 in accordance with the present invention which realizes the exemplary circuit 20. As particularly shown in FIG. 3, the MMIC 100 positions a distributed transmission-line network 110 over a microwave-device structure 130. Signal lines of the transmission-line network 110 are adapted to communicate with the microwave-device structure 130 through a ground plane of the network 110. The transmission-line network 110 also includes a microwave dielectric which can be deposited in a thickness that is compatible with wide, low-loss signal lines. These structures facilitate the realization of the MMIC 100 in a silicon-based semiconductor system whose performance is comparable with other high-speed semiconductor systems, e.g., GaAlAs/GaAs and InGaAs/InP, and whose fabrication costs are significantly less than these systems. Prior to a detailed description of the MMIC 100, attention is first directed to a preliminary description of the exemplary microwave circuit schematic 20, The schematic 20 shows a microwave amplifier in which two microwave transistors 22 and 23 are positioned to share signal amplification between an input port 24 and an output port 26. The bases of the transistors 22 and 23 are coupled to the input port 24 by impedance matching networks 28 and a power divider 30. The collectors of the transistors 22 and 23 are coupled to the output port 26 by impedance matching networks 32 and a power combiner 34. The transistors' emitters are coupled to ground.

The power divider 30 and power combiner 34 are a type of circuit which is commonly called a Wilkinson power divider in the microwave art. The input divider 30 includes two transmission lines 36 and 38 which are connected at one end to an input transmission line 40 and which are coupled at another end by a resistive load 42. The ends of the load 42 are at circuit nodes 44 and 45. The divider is intended to split power which enters at the input port 24 and deliver it to the nodes 44 and 45 and also convert a selected impedance which it "sees" at the circuit nodes 44 and 45 to a selected impedance at the input port 24. The impedance at the input port is conventionally 50Ω and that is assumed to be the case in the circuit 20 for clarity of description.

Each of the lines 36 and 38 are configured to have a characteristic impedance of 70.7Ω and have a length of ¼ of the operating wavelength, i.e., they are quarter-wave transformers. As is well known in the microwave art, a quarter-wave line which has an impedance $Z_L$ is related to the impedances at each end $Z_1$ and $Z_2$ by the relationship $Z_L=(Z_1Z_2)^{1/2}$. Thus the lines 36 and 38 will each transform an impedance of 50Ω at the circuit nodes 44 and 45 to 100Ω at their opposite ends where they are coupled in parallel to the input transmission line 40.

Because these impedances are in parallel, the input line 40 is presented with a 50Ω impedance. The input transmission line is configured to have a characteristic impedance of 50Ω so that it transforms the impedance of the two lines 36 and 38 to 50Ω at the input port 24. If the load 42 is selected to have an impedance of 100Ω, signals at the two circuit nodes 44 and 45 will be substantially isolated from each other.

The impedance matching networks 28 are configured to transform the input impedance of the transistors 22 and 23 to 50Ω at the circuit nodes 44 and 45. These networks 28 are assumed to include a series capacitor 52 and transmission line 54 and a shunt capacitor 56.

The impedance matching networks 32 and the output power combiner 34 are configured in a manner similar to that described for the matching networks 28 and power divider 30. The power combiner 34 has parallel transmission lines 60 and 62 that couple to circuit nodes 63 and 64 to an output transmission line 66. The combiner also has an isolation resistor 67. The impedance matching networks 32 each include a shunt capacitor 68 and a series transmission line 70 and a series capacitor 72.

Each of the transistors 22 and 23 is conventionally biased by resistors 74, 75 and 76 from a supply voltage $V^+$. The supply voltage is decoupled by a capacitor 78 and a transmission line 79 converts the low impedance of the decoupling capacitor 78 to a suitable collector impedance for the transistors. Each of the input port 24 and output port 26 have a signal pad 80 and a ground pad 82.

The microwave circuit 20 couples microwave transistors 22 and 23 in parallel between the input port 24 and the output port 26. In operation, a microwave signal received at the input port 24 is divided into two portions which are separately amplified by the transistors 22 and 23. The amplified signals are then combined at the output port 26. The transistors 22 and 23 are able therefore to amplify a larger signal than they could handle separately. The impedance matching networks 28 and 32 are typically configured to convert the 50Ω impedance at the input circuit nodes 44 and 45 and output circuit nodes 63 and 64 into impedances at the base and collector of the transistors 22 and 23 that realizes a gain which is consistent with stability.

Attention is now redirected to the MMIC 100 as illustrated in FIGS. 2–4. In these figures, the MMIC 100 is configured as a silicon-based, monolithic circuit which has a distributed transmission-line network 110 (operation of distributed networks is described in terms of magnetic and electric fields and the distributed network constants). The network 110 is positioned over a lumped and active element circuit in the form of the microwave-device structure 130. The transmission line structure 110 includes a set of transmission signal lines 112 which are spaced from a ground plane 114 by a microwave dielectric 116. The dielectric 116 preferably has a thin first layer 117 adjacent the ground plane 114 and a thicker, second layer 118 adjacent the signal lines 112. The transmission line network 110 is configured in conventional microstrip form, i.e., signal lines spaced above a ground plane by a dielectric.

In FIG. 2, the set 112 of signal lines include all the transmission lines of the schematic 20. For example, positioned on the left side of the MMIC 100 are the input line 40, the power divider lines 36 and 38 and the impedance matching lines 54. The divider lines 36 and 38 are thinner than the input line 40 and the impedance matching lines 54 which reflects the difference in their impedance, i.e., 70.7Ω versus 50Ω. The capacitors 56 and 52 are realized at each end of the lines 54.

Positioned on the right side of the MMIC 100 are the output line 66, the power combiner lines 60 and 62 and the impedance matching lines 70. As in the input structure, the combiner lines 60 and 62 are thinner than the output line 66 and the impedance matching lines 70. The capacitors 68 and 72 are realized at each end of the lines 70.

Positioned between the input and output transmission lines, are the lines 79 which couple the low, decoupling impedance of capacitors 78 at one end of the line to the transistor collectors which are reached through vias 119 at the other line end.

The input and output ports 24 and 26 are defined by pads 80 and 82. Other pads 106 at the top and bottom of the MMIC 100 are spaced from the ground plane 112. They are available for connecting to other electrical forms, e.g., $V^+$.

The lumped and active elements of the schematic 20 are carried on a silicon substrate 120 in the microwave-device structure 130. These elements include the transistors 22 and 23 and the resistors 74, 75 and 76. For clarity of illustration, only the transistor 23 is shown in FIG. 3. The transistor 23 has an emitter ohmic contact 122, base ohmic contacts 124 and collector ohmic contacts 126.

The microwave-device structure 130 also includes an interconnect system 132 which has patterned layers 133 and 134 of conductive members, e.g., the members 138 and 139, which are separated by dielectric layers 135, 136 and 137 (the layers 133 and 134 are indicated by broken lines). The dielectrics are preferably chosen from materials, e.g., silicon dioxide and polyimide, which are well known to have low-loss microwave characteristics. The interconnect structure 132 is also carried on the silicon substrate 120. The substrate 120 is much thicker than the other structure of the MMIC 100 and is accordingly illustrated with a horizontal section removed.

The MMIC 100 would typically be mounted in a microwave package which is not shown for clarity of illustration. Connections, e.g., wirebonds, would typically be made between the pads 80, 82 and 106 to pins or transmission lines in the package perimeter. The MMIC 100 could then be integrated into a larger microwave circuit. Alternatively, the MMIC 100 could be mounted onto a larger substrate with other MMICs and be connected together to form a multichip module (MCM).

FIG. 3 illustrates the structure of the via 119 along the plane 3—3 of FIG. 2. The figure shows an aperture 150 in the ground plane 114. A pad 152 of the ground plane 114 is left within the aperture 150. The spacing between a portion 154 of the signal line 79 and the ground plane 114 is eliminated in the vicinity of the aperture 150. In particular, the signal line portion 154 is directed downward through the dielectric 118 to contact the pad 152. The pad 152 is further connected through the conductive member 138 to one of the collector ohmic contacts 126 of the transistor 23. This connection is made through conventional via structures 156 and 158 (indicated by solid lines) between the layers of the interconnect system 132.

The structure of the via 119 can be formed by creating an opening in the dielectric 116 and continuing the plating of the transmission line 79 down into this opening. Although the pad 152 may facilitate coupling the signal line portion 154 to the collector contact 126, it may be eliminated in other embodiments of the invention with the portion 154 brought directly into communication with the conductive member 138 by the interconnect via 156.

The capacitor 72 is formed in a manner similar to that of the via 119. An aperture 160 is defined by the ground plane 114 and a pad 162 is left in the aperture. The capacitor 72 is formed by reducing the spacing between a portion 164 of the signal line 70 and the pad 162. The space 168 between the portion 164 and the pad 162 is preferably adjusted so that the dielectric 117 forms the dielectric between the capacitor plates formed by the portion 164 and the pad 162. The pad 162 is connected to the other collector ohmic contact 126 through the interconnect member 139 and conventional vias 169 and 170 in the interconnect system 132. In FIG. 3, the emitter ohmic contact 122 is directly connected to the ground plane 114.

FIG. 4 is a view similar to FIG. 3 with like elements indicated by like reference numbers. This figure illustrates the structure of a transmission line ground as formed along the plane 4—4 of the ground pad 82 in FIG. 2. The spacing between a portion 174 of the signal line and the ground plane 114 is eliminated, i.e., the signal line is plated down through an opening in the dielectric 116 to contact the ground plane. Many microwave circuits, require that transmission signal lines be terminated by a microwave short. These shorts can be formed as shown by the ground pad 82. Transmission signal lines can also form inductors as illustrated by the spiral inductor 180 of FIG. 5 which is positioned at the end of a signal line 182. The inductor 180 is formed of a spiral shaped signal line 184 with ends 186 and 188. The ends of the inductor can also have capacitor structures to the ground plane as in FIG. 3 or a microwave short as in FIG. 4.

The signal lines, e.g., line 36, of the distributed transmission-line network 110 of FIGS. 2–4 are preferably realized with a low-loss conductive metal that is compatible with MMIC fabrication, e.g., electroplated gold. Similarly, low-loss conductive metals or alloys, e.g., aluminum-copper, may be advantageously used for the ground plane 114.

The dielectric layer 118 is the principle transmission-line dielectric. As such, it preferably has a low dielectric constant and a low loss tangent. For ease of fabrication, it also should have good adhesion to substrates and metals.

Increasing the signal line widths, e.g., the width 189 in FIG. 2, lowers the microwave path losses of the transmission-line network 110. For a given transmission-line impedance, an increased spacing between the signal line and the ground plane requires an increased width of the line. Therefore, another preferred characteristic of the dielectric 118 is that it can be deposited in relatively thick layers, e.g., at least 10 microns and, preferably, on the order of 13 microns, so that wide, low-loss signal lines can be realized. Finally, for consistent impedance it is desirable that the thickness of the dielectric be constant and that its upper surface is flat.

The structures of the invention are preferably realized with a dielectric that has the forgoing characteristics. An exemplary dielectric with these characteristics is benzocyclobutene (BCB) which a has a dielectric constant of 2.65 and a loss tangent of 0.002 at 10 GHz. This polymer can be deposited over a substrate by spin-coating. After the polymer is placed on a surface, the surface is rapidly spun which causes the BCB to assume a planar configuration. Openings in BCB can be fabricated by plasma etching or by reactive ion etching. Other embodiments of the invention can be formed with various dielectrics which have these desirable characteristics.

In order to reduce the lateral extent of the capacitor plates 162 and 164 in FIG. 3, the dielectric 117 preferably has a high dielectric. Preferred dielectrics for this structure are silicon dioxide and silicon nitride. Although the transmission-line dielectric 116 preferably includes the additional layer adjoining the ground plane 114, other embodiments of the invention can be formed with only a single dielectric.

Figure 6:
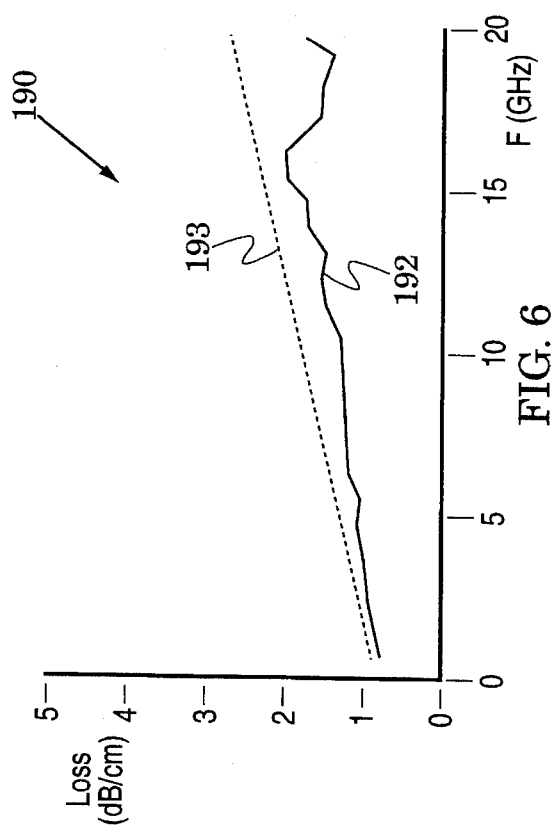
FIG. 6 is a graph of predicted and measured loss of a transmission line in the MMIC of FIG. 2.

An exemplary transmission line was formed in accordance with the teachings of the invention. It had an electroplated gold signal line with a width of 3 microns and a length of 2450 microns. It was spaced from a ground plane by a 13 micron thick dielectric of BCB. In the graph 190 of FIG. 6, the measured loss in decibels/centimeter of this transmission line is plotted as the curve 192. The loss was also predicted by a calculation in which the dielectric constant was assumed to be 3.3 and the loss tangent assumed to be 0.025 (these measured parameters are different than the values above which were manufacturer's ratings). The calculated loss is shown as the broken line 193. The measured loss agrees best with the calculated loss in the region below 5GHz.

Figure 7:
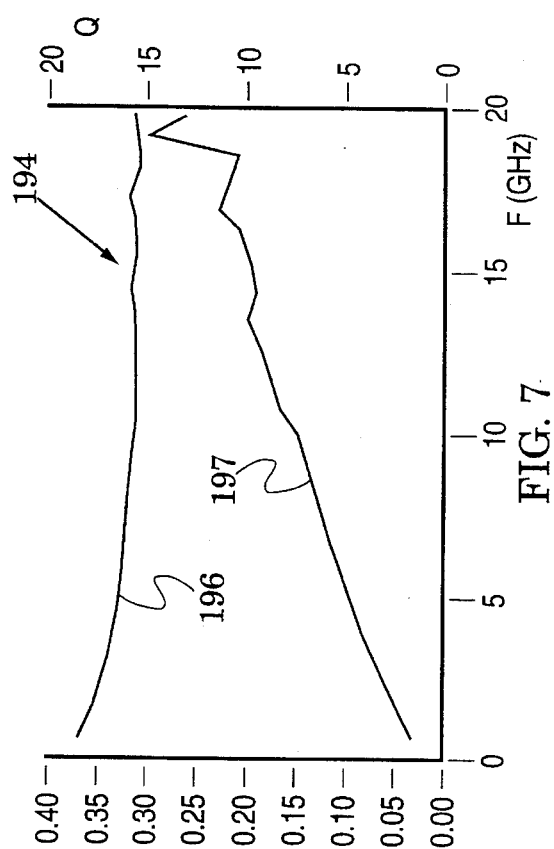
FIG. 7 is a graph of measured inductance and quality factor (Q) of the spiral inductor of FIG. 5.

An exemplary spiral inductor similar to the inductor 180 of FIG. 5 was also fabricated. It had two turns of 10 micron wide signal lines over a BCB substrate. The measured inductance and quality factor Q are plotted in the graph 194 of FIG. 7 as the curves 196 and 197 respectively.

In accordance with customary practice, the term monolithic microwave integrated circuit (MMIC) has been used in this description to refer to monolithic circuits which are intended to operate at frequencies above 1 GHz. The term millimeter wave generally is used to refer to frequencies in the range of 40 GHz to 300 GHz (IEEE Standard 521–1976). Thus, millimeter wave frequencies are a subset of microwave frequencies and are inherently included in the use of the term MMIC.

Although the signal line portions 154 and 164 in FIG. 3 and 174 in FIG. 4 are indicated as conical depressions of the signal lines, other embodiments of the signal line portions can be realized with equivalent depressions of the signal lines, e.g., a simple flat tab.

The teachings of the invention facilitate the combination of silicon-based devices and silicon substrates with low-loss transmission line networks. Thus, MMICs can include high frequency transistor structures, e.g., HBTs, which are fabricated in semiconductor systems e.g., GeSi/Si, that are less expensive than previously preferred systems such as GaAlAs/GaAs and InGaAs/InP.

The teachings of the invention also facilitate measurement of microwave device parameters prior to finalizing the MMIC fabrication. For example, in FIG. 3 the parameters of the transistor 23 could be measured with probes before deposition of the transmission-line network 110 over the microwave-device structure 130.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A monolithic microwave integrated circuit, comprising:
    a microwave-device structure which has;
        a) a semiconductor substrate,
        b) a plurality of microwave devices that are positioned on said
    substrate, and
        c) an interconnect system which is positioned on said substrate and configured to electrically interconnect said microwave devices;
and
    a distributed, transmission-line network configured to conduct microwave signals, said transmission-line network having:
        a) a ground plane;
        b) a plurality of microwave signal lines spaced above said ground plane; and
        c) a transmission-line dielectric between said signal lines and said ground plane;
    wherein:
        said transmission-line network is positioned on said interconnect system and communicates through said ground plane with predetermined devices of said microwave-device structure;
        the spacing between a portion of said signal lines and said ground plane is locally reduced to form a microwave capacitor;
        said ground plane defines an aperture and one of said signal lines communicates with said microwave-device structure through said aperture; and
        said transmission-line dielectric includes a first layer of benzocyclobutene and a second layer of silicon nitride with said second layer positioned between said signal line portion and said ground plane.

2. The monolithic microwave integrated circuit of claim 1, wherein the spacing between one of said signal lines and said ground plane is locally eliminated to form a microwave short.

3. The monolithic microwave integrated circuit of claim 1, wherein said interconnect system includes:
    at least one layer of conductive members; and
    an interconnect dielectric arranged to insulate said conductive members.

4. The monolithic microwave integrated circuit of claim 1, wherein:
    said semiconductor substrate is comprised of silicon; and
    said microwave devices include at least one microwave transistor configured in a silicon germanium/silicon semiconductor system.

5. A monolithic microwave integrated circuit, comprising:
    a silicon semiconductor substrate;
    a plurality of microwave devices carried on said substrate with said devices including a microwave transistor configured in a silicon germanium/silicon semiconductor system;
    an interconnect system which is carried on said substrate and configured to electrically interconnect said microwave devices; and
    a distributed, transmission-line network configured to distribute microwave signals, said network having:
        a) a ground plane positioned over said interconnect system with said ground plane defining an aperture;
        b) a transmission-line dielectric positioned over said ground plane; and
        c) at least one signal line which is positioned over said transmission-line dielectric and communicates through said dielectric and said aperture with one of said microwave devices.

6. The monolithic microwave integrated circuit of claim 5, wherein said transmission-line dielectric comprises benzocyclobutene.

7. The monolithic microwave integrated circuit of claim 5, wherein said interconnect system includes:
    at least one layer of conductive members; and
    an interconnect dielectric arranged to insulate said conductive members.

8. The monolithic microwave integrated circuit of claim 5, wherein: the spacing between a portion of said signal lines and said ground plane is locally reduced to form a microwave capacitor; and
    said transmission-line dielectric includes a first layer of benzocyclobutene and a second layer of silicon nitride with said second layer positioned between said signal line portion and said ground plane.

9. The monolithic microwave integrated circuit of claim 5, wherein: the spacing between a portion of said signal lines and said ground plane is locally reduced to form a microwave capacitor; and said transmission-line dielectric includes a first layer of benzocyclobutene and a second layer of silicon dioxide with said second layer positioned between said signal line portion and said ground plane.

10. A monolithic microwave integrated circuit, comprising:

a silicon semiconductor substrate;

a plurality of microwave devices carried on said substrate with said devices including a microwave transistor configured in a silicon semiconductor system;

an interconnect system which is carried on said substrate and configured to electrically interconnect said microwave devices; and a distributed, transmission-line network having:
  a) a ground plane positioned over said interconnect system with said ground plane defining an aperture;
  b) a transmission-line dielectric positioned over said ground plane;
  c) at least one signal line which is positioned over said transmission-line dielectric and communicates through said dielectric and said aperture with one of said microwave devices; and;

a capacitor which is formed between a portion of said signal lines and said ground plane;

wherein said transmission-line dielectric includes a first dielectric layer having a first dielectric constant and a second dielectric layer having a second dielectric constant which is greater than said first dielectric constant with said second dielectric layer positioned between said signal line portion and said ground plane.

11. The monolithic microwave integrated circuit of claim 10, wherein said first dielectric layer comprises benzocyclobutene.

12. The monolithic microwave integrated circuit of claim 10, wherein said second dielectric layer comprises silicon nitride.

13. The monolithic microwave integrated circuit of claim 10, wherein said second dielectric layer comprises silicon dioxide.

* * * * *